US006909767B2

(12) United States Patent
White

(10) Patent No.: US 6,909,767 B2
(45) Date of Patent: Jun. 21, 2005

(54) LOGIC CIRCUIT

(75) Inventor: Benjamin Earle White, Warwick (GB)

(73) Assignee: Arithmatica Limited, Oxford (GB)

( * ) Notice: Subject to any disclaimer, the term of this patent is extended or adjusted under 35 U.S.C. 154(b) by 0 days.

(21) Appl. No.: 10/757,712

(22) Filed: Jan. 14, 2004

(65) Prior Publication Data

US 2004/0201411 A1 Oct. 14, 2004

Related U.S. Application Data

(60) Provisional application No. 60/439,852, filed on Jan. 14, 2003.

(51) Int. Cl.[7] .............................................. G06F 17/00
(52) U.S. Cl. ........................................... 377/49; 377/4
(58) Field of Search ....................................... 377/4, 49

(56) References Cited

U.S. PATENT DOCUMENTS

| 3,634,658 A | 1/1972 | Brown .................. 235/92 LG |
| 3,711,692 A | 1/1973 | Batcher |
| 3,757,098 A | 9/1973 | Wright ....................... 235/175 |
| 4,399,517 A | 8/1983 | Niehaus et al. ............. 364/784 |
| 4,463,344 A | 7/1984 | Adler et al. ......... 340/347 DD |
| 4,596,256 A | 6/1986 | Ascher et al. .............. 128/710 |
| 4,607,176 A | 8/1986 | Burrows et al. ............ 307/449 |

(Continued)

FOREIGN PATENT DOCUMENTS

| EP | 0168650 | 1/1986 | ........... G06F/15/60 |
| EP | 0309292 | 3/1989 | ........... G06F/15/60 |
| EP | 0442356 | 8/1991 | ............. G06F/7/50 |
| EP | 0741354 | 11/1996 | ............. G06F/7/50 |
| EP | 0992882 A2 | 4/2000 | |
| FR | 2475250 | 8/1981 | ............. G06F/7/38 |
| GB | 2016181 | 9/1979 | ............. G06F/7/39 |
| GB | 2062310 | 5/1981 | ............. G06F/7/52 |
| GB | 2365636 | 2/2002 | ............. G06F/7/60 |
| GB | 2365637 | 2/2002 | ............. G06F/7/60 |
| WO | WO-99/22292 | 5/1999 | ............. G06F/7/52 |
| WO | WO-02/12995 | 2/2002 | ............. G06F/7/00 |

OTHER PUBLICATIONS

Bedrij, O. J., "Carry–Select Adder," *IRE Trans., EC–11*, (Jun. 1962), 340–346.

(Continued)

*Primary Examiner*—Margaret R. Wambach
(74) *Attorney, Agent, or Firm*—Schwegman, Lundberg, Woessner & Kluth, P.A.

(57) ABSTRACT

Circuit for selecting a second set of binary inputs according to the number of high input signals applied to a first input set. A first subcircuit has the first input set, logic generating control output signals, each control output signal represents whether the first input set has exactly a predetermined number of high input signals. Each control output signal corresponds to a different predetermined number of high input signals. A second subcircuit has a second input set, a set of control inputs for receiving control output signals from the first subcircuit, and logic including a plurality of switches including one or more pass gates. Each switching component switches to connect or isolate one of the second input set to a common output. The control inputs control the switches. The first and second subcircuits are configured such that only one switch can be switched to connect at a time.

33 Claims, 12 Drawing Sheets

U.S. PATENT DOCUMENTS

| | | | |
|---|---|---|---|
| 4,993,421 A | 2/1991 | Thornton | 128/670 |
| 5,095,457 A | 3/1992 | Jeong | 364/758 |
| 5,175,862 A | 12/1992 | Phelps et al. | 395/800 |
| 5,187,679 A | 2/1993 | Vassiliadis et al. | 364/786 |
| 5,325,320 A | 6/1994 | Chiu | 364/760 |
| 5,343,417 A | 8/1994 | Flora | 364/758 |
| 5,363,099 A | 11/1994 | Allen | 341/107 |
| 5,475,388 A | 12/1995 | Gormish et al. | 341/107 |
| 5,497,342 A | 3/1996 | Mou et al. | 364/786 |
| 5,524,082 A | 6/1996 | Horstmann et al. | 364/489 |
| 5,712,792 A | 1/1998 | Yamashita et al. | 364/489 |
| 5,964,827 A | 10/1999 | Ngo et al. | 708/710 |
| 5,995,029 A | 11/1999 | Ryu | 341/101 |
| 6,023,566 A | 2/2000 | Belkhale et al. | 395/500.03 |
| 6,173,414 B1 | 1/2001 | Zumkehr et al. | 714/6 |
| 6,175,852 B1 | 1/2001 | Dhong et al. | 708/712 |
| 6,269,386 B1 | 7/2001 | Siers et al. | 708/710 |
| 6,430,251 B1 | 8/2002 | Gold | |
| 6,470,443 B1 | 10/2002 | Emer et al. | |
| 6,490,608 B1 | 12/2002 | Zhu | 708/626 |
| 2002/0026465 A1 | 2/2002 | Rumynin et al. | 708/210 |
| 2002/0078110 A1 | 6/2002 | Rumynin et al. | 708/210 |
| 2004/0153490 A1 | 8/2004 | Talwar et al. | |

OTHER PUBLICATIONS

Booth, Andrew, "A Signed Binary Multiplication Technique," *Oxford University Press, Reprinted from Q.J. Mech, Appl. Math. 4:236–240*, (1951), pp. 100–104.

Chakraborty, S., et al., "Synthesis of Symmetric Functions for Path–Delay Fault Testability," *12th International Conference on VLSI Design*, (1999), pp. 512–517.

Dadda, L., "On Parallel Digital Multipliers," *Associazione Elettrontecnia ed Elettronica Italiana, Reprinted from Alta Freq. 45:574–580*, (1976), pp. 126–132.

Dadda, L., "on Parallel Digital Multipliers," *Associazione Elettrontecnia ed Elettronica Italiana*, Reprinted from Alta Freq. 45:574–580, (1976), pp. 126–132.

De Micheli, G., et al., "Optimal State Assignment for Finite State Machines," *IEEE Transactions on Computer–Aided Design, vol. CAD–4 (3)*, (Jul. 1985), pp. 269–285.

Debnath, D., "Minimization of AND–OR–EXOR Three–Level Networks with AND Gate Sharing," *IEICE Trans, Inf. & Syst., E80–D, 10*, (1997), pp. 1001–1008

Drechsler, R., et al., "Sympathy: Fast Exact Minimization of Fixed Polarity Reed–Muller Expressions for Symmetric Functions," *IEEE Transactions on Computer–Aided Design of Integrated Circuits and Systems, 16(1)*, (1997), pp. 1–5.

Fleisher, H, "Combinatorial Techniques for Performing Arithmetic and Logical Operations," *IBM Research Center, RC–289, Research Report*, (Jul. 18, 1960), 22 pages.

Foster, Caxton, et al., "Counting Responders in an Associative Memory," *The Institute of Electrical and Electronics Engineers, Inc.*, Reprinted, with permission, from IEEE Trans. Comput. C–20:1580–1583, (1971), pp. 86–89.

Goto, et al., "A 54 × 54–b Regularly Structured Tree Multiplier," *IEEE Journal of Solid–State Circuits, vol. 27, No. 9*, (Sep. 1992), pp. 1229–1236.

Hekstra, et al., "A Fast Parallel Multiplier Architecture," *IEEE International Symposium on Circuits and Systems; Institute of Electrical and Electronic Engineers, c1977–c1996, 20v.II :28cm*, (1992), pp. 2128–2131.

Ho, I., et al., "Multiple Addition by Residue Threshold Functions and Their Representation By Array Logic," *The Institute of Electrical and Electronics Engineers, Inc., Reprinted, with permission from IEEE Trans. Comput. C–22: 762–767*, (1973), pp. 80–85.

Jones, Robert, et al., "Parallel Counter Implementation," *Conf. Rec. 26th Asilomar Conf. Signals, Systems & Computers*, vol. 1, ISBN 0–8186–3160–0, (1992), pp. 381–385.

Knowles, S., "A Family of Adders," *Proc. 14th IEEE Symp. on computer Arithmetic*, (1999), pp. 30–34.

Koc, C, "High–Speed RSA Implementation," available at ftp://ftp.rsasecurity.com/pub/pdfs/tr201.pdf., Version 2.0, (Nov., 1994), 73 pages.

Koc, C, "RSA Hardware Implementation," available at ftp://ftp.rsasecurity.com/pub/pdfs/tr801.pdf., Version 1.0, (Aug., 1995), 30 pages.

Kogge, P.M., et al., "A Parallel Algorithm for the Efficient Solution of a General Class of Recurrence Equations," *IEEE Trans. Computers.vol. C–22, No. 8*, (Aug. 1973), pp. 786–793.

Ladner, Richard E., et al., "Parallel Prefix Computation," *Journal of ACM, vol. 27, No. 4*, (Oct. 1980), pp. 831–838.

Ling, Huey, "High–Speed Binary Adder," *IBM Journal of Research and Development* vol. 25, No. 3, (1981), pp. 156–166.

Monteiro, J., et al., "Bitwise Encoding of Finite State Machines," *Proceedings of the 7th International Conference on VLSI Design*, (Jan. 1994), pp. 379–382.

Nienhaus, H., "Efficient Multiplexer Realizations of Symmetric Functions," *IEEE*, (1981), pp. 522–525.

Oklobdzija, V G., et al., "Improving multiplier design by using improved column compression tree and optimized final adder in CMOS technology," *IEEE transactions on Very Large Scale Integration (VLSI) Systems*, IEEE, Inc, New York, vol. 3, No. 2, (1995), pp. 292–301.

Sklansky, J., "Conditional–Sum Addition Logic," *IRE Trans., EC–9*, (Jun. 1960), pp. 226–231.

Swartzlander Jr., E E., "Parallel Counters," *IEEE Transactions on Computers, C–22(11)*, (Nov. 1973), pp. 1021–1024.

Swartzlander Jr., E E., "Parallel Counters," *IEEE Transactions on Computers, C–22(11)*, (Nov. 1973), pp. 1021–1024.

Vassiliadis, S., et al., "7/2 Counters and Multiplication with Threshold Logic," *IEEE*, (1997), pp. 192–196.

Villa, Tiziano, et al., "NOVA: State Assignment of Finite State Machines for Optimal Two–Level Logic Implementation," *IEEE Transactions on Computer–Aided Design*, vol. 9, No. 9, (Sep. 1990), pp. 905–924.

Wallace, C., "A Suggestion for a Fast Multipiler," *IEEE Transactions on Electronic Computers*, vol. EC–13, (1964), pp. 14–17.

Weinberger, A., et al., "A Logic for High–Speed Addition," *Nat. Bur. Stand. Circ., 591*, (1958), pp. 3–12.

Zuras, D, et al., "Balanced delay trees and combinatorial division in VLSI," *IEEE Journal of Solid State Circuits, SC–21*, IEEE Inc, New York, vol. SC–21, No. 5, (1986), pp. 814–819.

PCT International Search Report relating to PCT/GB2004/00135, (Jun. 17, 2004), 4 Pages.

"United Kingdom Search Report relating to Great Britain Patent Application No. GB0400799.3", (Jun. 23, 2004), 1 Page.

Tietze, U., et al., "Halbleiterschaltungstechnik", (1993), 226–227, 273–276.

[4,1]

[4,2]

[4,3]

[4,4]

US 6,909,767 B2

LOGIC CIRCUIT

RELATED APPLICATION

This application claims priority under 35 U.S.C 119(e) from U.S. Provisional Application Ser. No. 60/439,852 filed Jan. 14, 2003, which application is incorporated herein by reference.

FIELD OF THE INVENTION

The present invention relates to digital electronic devices, and in particular, to a digital electronic device performing binary logic.

BACKGROUND TO THE INVENTION

A fundamental requirement in digital electronics is a circuit which, depending on the number of highs amongst a second plurality of inputs, selects one of a first plurality of inputs. Such a circuit can be provided to indicate if the number of highs amongst k inputs belongs to any particular subset of the integers $\{0, 1, \ldots, k\}$.

Examples of such circuits include threshold circuits, which indicate if j or more of k total inputs are high. The threshold function [k,j] is low if there are less than j high inputs within k total inputs, but [k,j] is high if there are j or more high inputs within k total inputs. For example, [10,4] is low for 0 to 3 high inputs, but is high for 4 to 10 high inputs.

Further examples of such circuits include circuits to indicate whether or not an exact number of high inputs are present amongst k total inputs, the circuit outputting a high value only for this exact number of high inputs. This circuit implements the selection function <k,j>, which is defined to be high when k inputs has exactly j high inputs, and low when the number of high inputs in not equal to j. For example, the function <10,4> represents a system with 10 inputs, and is high only when exactly four of these ten inputs are high, otherwise it is low. This function <10,4>, when plotted for a range of different numbers of high inputs, gives a "top-hat" shape—i.e. it is zero if the system has 0 to 3 high inputs, it is 1 if the system has 4 high inputs, and it is zero if the system has 5 to 10 high inputs, where zero represents a low and 1 represents a high.

Such circuits as described above find applications in multiplication, counting, memory control, etc. These circuits often appear on the frequency-limiting paths of systems and can consume large silicon area, and much importance is placed on achieving speed and area improvements in their implementation.

For example, it is instrumental for many applications to have a parallel counter that adds n inputs of the same binary weight together, and produces an output that is a binary representation of the number of high inputs. Such parallel counters (L. Dadda, *Some Schemes for Parallel Multipliers*, Alta Freq 34: 349–356 (1965); E. E. Swartzlander Jr., *Parallel Counters*, IEEE Trans. Comput. C-22: 1021–1024 (1973)) are used in circuits performing binary multiplication. There are other applications of a parallel counter, for instance, majority-voting decoders or RSA encoders and decoders. It is important to have an implementation of a parallel counter that achieves a maximal speed.

The following notation is used for logical operations on Boolean variables (such that take one of two values, high and low):

a b denotes the AND of a and b, which is high if a and b are high.

a+b denotes the OR of a and b, which is high if a is high or b is high.

a⊕b denotes the exclusive OR of a and b, which is high if a and b have different values.

a-bar is the complement of a, which is high if a is low.

$\Sigma_{i=a}^{i=b} S(i)$ denotes the OR of a plurality of Boolean expressions, i.e. $S(a)+S(a+1)+ \ldots +S(b)$.

SUMMARY OF THE INVENTION

The present invention provides a circuit for selecting one binary input from a set of binary inputs, according to the number of high input signals applied to a further set of binary inputs. The circuit includes a first subcircuit with a first set of binary inputs, and logic to generate a set of control output signals. In many applications, this first set of binary inputs will be a plurality of binary inputs, although it is also possible to use a single binary input and determine whether one or zero high input signals are present at any time. Each of the generated control output signal represents whether or not the first set of binary inputs has exactly a predetermined number of high inputs signals. Each control output signal corresponds to a different predetermined number of high input signals. The circuit may generate a control output signal for each possible number of high input signals, or it may generate a control output signal for only some of the possible numbers of high input signals.

The circuit also includes a second subcircuit with a second set of binary inputs, a set of control inputs for receiving control output signals from the first subcircuit, and logic which includes a plurality of switching components. Some or all of the switching components can comprise at least one pass gate. Each switching component is switchable to connect or isolate one of the second set of inputs to a common output. The switching of each switching component is controlled using a signal from one of the control inputs. The first and/or second subcircuits are configured such that only one switching element can be switched to connect at any one time.

The number of control inputs to the second subcircuit is preferably equal to the number of control output signals from the first subcircuit, although this is not essential.

Some of the second binary inputs may be fixed low or ma high voltage, for example, by being connected to the earth terminal of the circuit or to the positive voltage supply terminal of the circuit. In that case, it not necessary for these binary inputs to be separate inputs, and they may be combined or connected together.

Embodiments of the present invention may be used in standard cells, and in this case, it is advantageous for the circuit to have well defined input and output impedences. The circuit may be provided with a high output impedance by connecting high impedance buffer means between the pass gate outputs and the common output of the circuit. Alternative types of switching components may also benefit from a high impedance buffer means. Either a single buffer may be connected at the common output, or a plurality of individual buffers may be connected to each switching component output.

The switching components used in the invention are not limited to include only pass gates and transistors, and other types of switching components may also be used.

Embodiments of the present invention have several advantages over the prior art. The use of non-hierarchical multiplexers (muxes), built from pass-gates, as switching components has the advantage of achieving greater speed of evaluation, and reducing the silicon area needed to implement the circuit. It also provides a greater ease of layout compared with previous methods.

A pass gate may be constructed from an n-type and a p-type transistor, each with a source, a drain and a gate terminal. The p-type source terminal is connected to the n-type source terminal, and the p-type drain terminal is connected to the n-type drain terminal. The p-type and n-type gate terminals are not connected together, so that each can receive a different input signal.

When a high input is applied to the gate of the n-type transistor, the transistor can conduct a signal from source to drain, but when a low input is applied, the transistor can no longer conduct the signal. The opposite is true for the p-type transistor, which can conduct only when a low input is applied to its gate. Thus, a pair of opposite binary signals may be applied to the gates of the p-type and n-type transistors to open or close the pass gate. The pass gate is closed when the n-type transistor gate input is low and the p-type transistor gate input is high, such that neither transistor can conduct a signal from source to drain.

When the pass gate is open (i.e. when the n-type transistor gate input is high and the p-type transistor gate input is low), the p-type transistor can conduct a high signal from source to drain, and the n-type transistor can conduct a low signal from source to drain. Therefore both transistors are necessary to allow either a high or a low signal to be conducted through the pass gate.

The circuit may include a third subcircuit to generate a function such as a selection function or threshold function. One of the functions outputted by the third subcircuit may be selected by the second subcircuit according to the number of high inputs in the first set of binary inputs. Selection may be configured such that the output of the third subcircuit reflects the total number of high inputs to both the first and the third subcircuits. This has the advantage that instead of one subcircuit having to deal with a large number of inputs, the total number of inputs to be counted can be split between a plurality of subcircuits, and the logic provided in each subcircuit can thus be more straightforward.

The total number of inputs may be divided yet further by employing a circuit with a tree-like structure, where a plurality of first and third subcircuits are provided at the first level of the tree structure, and each of these passes its outputs to a second subcircuit to generate an intermediate count signal. The intermediate count signals are passed to the second level of the tree structure, where they are summed by further first, second and third subcircuits. Thus, selection functions <kj> or threshold functions [k,j] or other functions relating to a count of the number of high inputs may be generated easily for high values of k. This has application in a parallel counter circuit which generates a binary representation of the number of high signals on its inputs.

DETAILED DESCRIPTION OF EMBODIMENTS OF THE INVENTION

Figure 1:
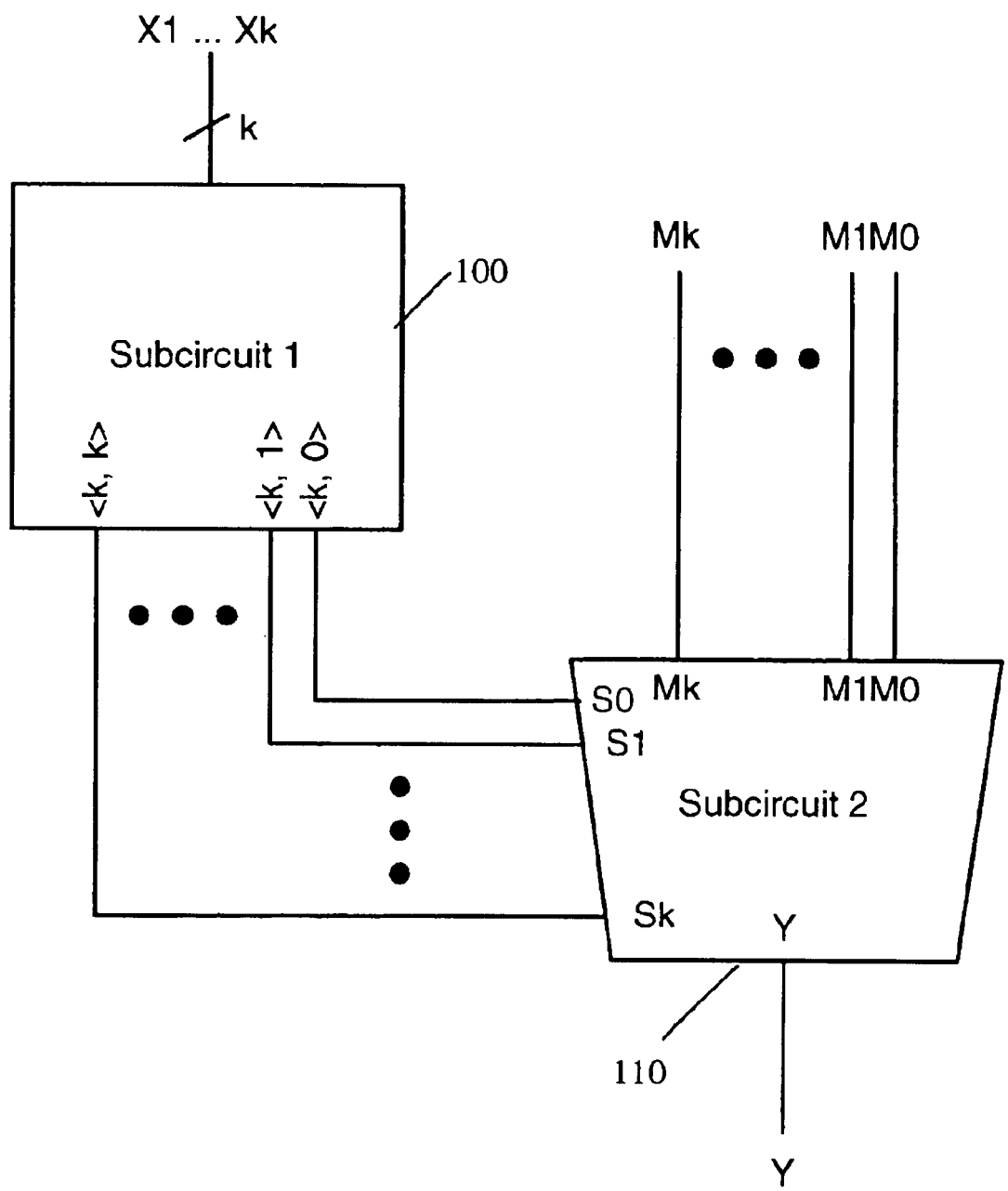
FIG. 1 is a block diagram illustrating the circuit according to a first embodiment of the invention.

FIG. 1 is a block diagram of a circuit according to a first embodiment of the invention.

The circuit selects one of a plurality of binary inputs M0, . . . ,Mk, depending on the number of highs amongst a further plurality of binary inputs X1, . . . ,Xk. The circuit has two subcircuits: a first subcircuit 100 and a second subcircuit 110.

The first subcircuit 100 determines the number of highs amongst the further plurality of binary inputs, $X_1, \ldots X_k$. There are a total of k binary inputs $X_1, \ldots, X_k$ to subcircuit 100. Subcircuit 100 generates k+1 outputs, consisting of a series of selection functions <k,j>, where j is an integer between 0 and k. Each selection function outputs a high value if there are exactly j high inputs amongst the k inputs to subcircuit 100, and outputs a low value if there are less than or greater than j high inputs amongst the k inputs to subcircuit 100. Each of the selection functions from j=0 to j=k is generated as a separate output signal, giving k+1 output signals. Only one of these output signals can be high at any one time, because each output signal relates to a different number of highs in the inputs X1, . . . ,Xk.

Thus, for example, if only one input to subcircuit 100 is high, then the first output signal <k,0> is low, the second output signal <k,1> is high, and the subsequent output signals <k,j> for j>1 are all low. If instead, exactly two inputs are high, then the first and second output signals <k,0> and <k,1> are low, the third output signal <k,2> is high, and the subsequent output signals <k,j> for j>2 are all low.

The function <k,j> is a symmetric function, because its value is determined only by the total number of high inputs, and not by their order. Thus, the inputs X1, . . . ,Xk of subcircuit 100 are interchangeable with one another.

The k+1 output signals, <k,0> to <k,k>, of subcircuit 100 are passed to control inputs S0, . . . ,Sk of subcircuit 110.

The second subcircuit 110 is a non-hierarchical multiplexer. It has k+1 control inputs So, . . . ,Sk, of which only one can be high at once. This condition is met by the set of functions <kj>, because for a given number of highs within k inputs, only one value of j will correspond to that given number, thus only one of the set of functions <k,j> will be high. Subcircuit 110 also has k+1 inputs Mo, . . . ,Mk, and one output Y. The control inputs S0, . . . ,Sk determine, in a one-to-one correspondence, which of the inputs M0, . . . ,Mk is passed to the output Y.

Since the control inputs S0, . . . ,Sk of multiplexer 110 receive the functions <k,j> generated by subcircuit 100 as input signals, then the multiplexer input selected from M0, . . . ,Mk depends on how many of the inputs X1, . . . , Xk to subcircuit 100 are high.

Although the control inputs S0, . . . ,Sk of the multiplexer 110 are controlled by a symmetric function <k,j>, it is not necessary that the signals on inputs M0, . . . ,Mk of the multiplexer 110 should be symmetric.

Figure 2:
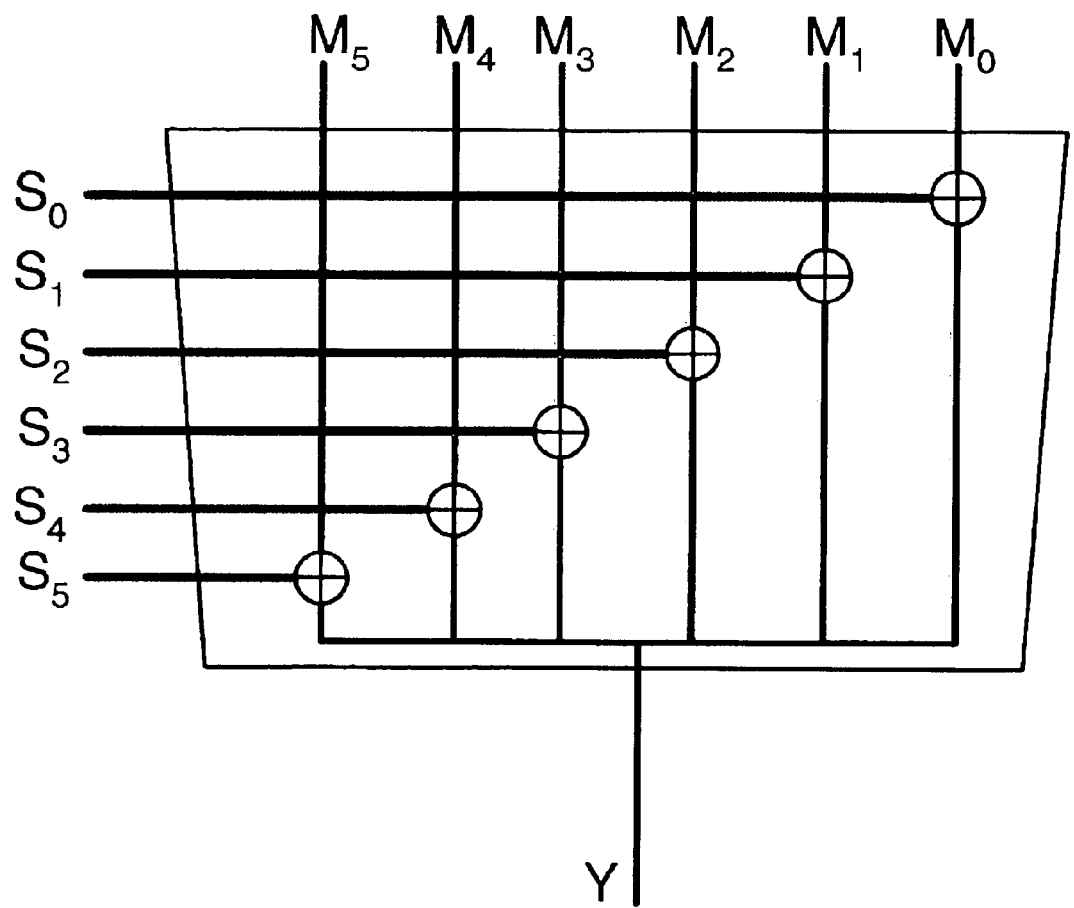
FIG. 2 is a schematic diagram of the non-hierarchical multiplexer of FIG. 1.

FIG. 2 shows a schematic diagram of the internal connections within the multiplexer 110. In the example, a value of k=5 is used, such that the multiplexer 110 has six inputs M0 to M5, six control inputs S0 to S5 and one output Y. The control inputs S0, . . . ,S5 each, in effect, open or close a switch to select one of the multiplexer inputs M0, . . . ,M5 as the final output Y. As is shown, S0 controls the M0 input, S1 controls the M1 input, S2 controls the M2 input, etc. Only one of the S0, . . . ,Sk control lines may be high at once, such that only one of the switches will be open at any time. In the circuit of FIG. 1, there will always be exactly one high control line S0, . . . ,Sk regardless of the number of highs on the inputs X1, . . . ,Xk, therefore there will always be precisely one of the switches open at any time.

Figure 3:
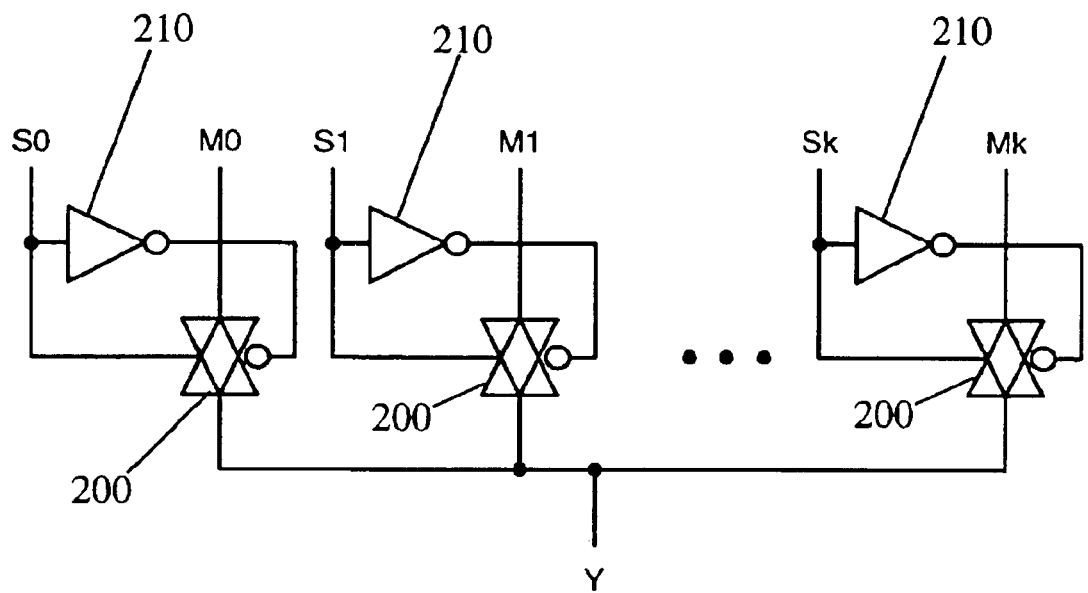
FIG. 3 is a circuit diagram showing a transistor-level implementation of the non-hierarchical multiplexer of FIG. 1.

FIG. 3 shows a transistor level implementation of the non-hierarchical multiplexer 110 of FIG. 1. Each input M0, . . . ,Mk of the multiplexer is connected via a pass gate 200 to a common output Y. Each pass gate 200 has one of inputs Mo, . . . ,Mk connected to its source terminal. The drain terminals of each of the pass gates 200 are all connected to the common output Y.

The gate terminal of the p-type side of the pass gate 200 is symbolised by a circle. When a high input is applied to the gate terminal of the n-type side, and a low input is applied to the gate terminal of the p-type side, the pass gate 200 will be open. When a low input is applied to the gate terminal of the n-type side, and a high input is applied to the gate terminal of the p-type side, the pass gate 200 will be closed.

To maintain opposite binary signals on each of the two gate terminals, each n-type gate terminal is connected directly to one of the control inputs S0, . . . ,Sk, and each corresponding p-type gate terminal is connected via an inverter 210 to that same one control input. Thus, for any integer j, when control input Sj is high, the j-th pass gate will be open, and the input Mj will be passed to the output Y. When Sj is low, the j-th pass gate will be closed, and the input Mj will be isolated from the output Y.

No short circuits between the pass gates are possible, because only one of the outputs of subcircuit 100 will ever be high at a time. The use of pass gates is faster than using NAND gates.

Figure 4:
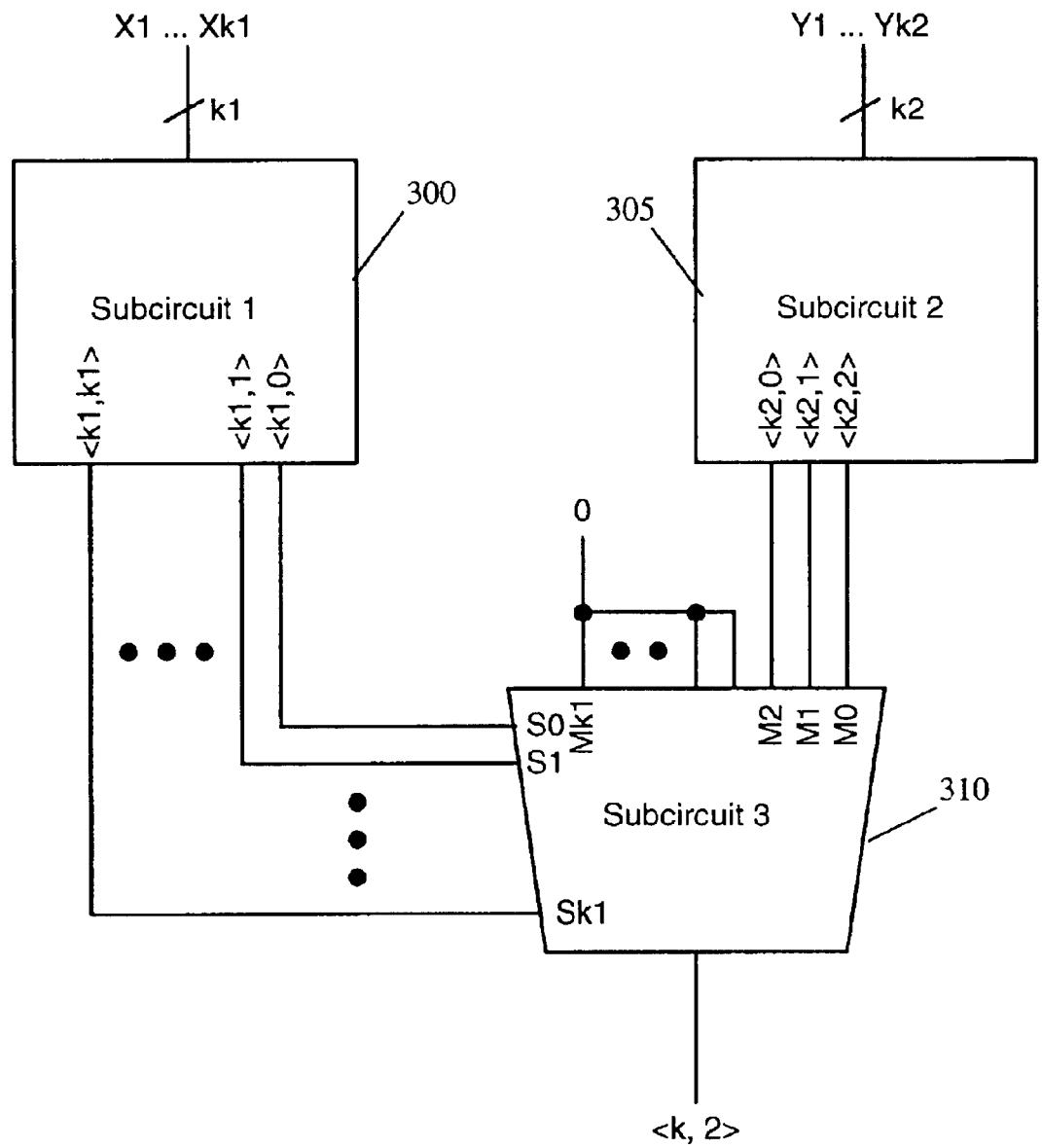
FIG. 4 is a block diagram showing a circuit according to a second embodiment of the invention.

FIG. 4 shows a block diagram of a circuit according to a second embodiment of the invention. This circuit has k inputs, and generates the selection function <k,2>, which indicates whether or not exactly two of the k inputs are high. The inputs are divided into two separate groups of inputs, $X_1, \ldots, X_{k1}$ and $Y_1, \ldots, Y_{k2}$. The first group has $k_1$ inputs, and the second group has $k_2$ inputs, such that the total number of inputs k=k1+k2.

The circuit of FIG. 4 includes a subcircuit 300, a subcircuit 305, and a subcircuit 310. The subcircuit 300 is similar to the first subcircuit 100 of FIG. 1, but has k1 inputs X1, . . . ,Xk1 and generates k1+1 output signals <k1,0> to <k1,k1>, each indicating whether or not a particular number of the inputs X1, . . . ,Xk1 are high.

The subcircuit 305 has k2 inputs Y1, . . . ,Yk2. Subcircuit 305 also generates functions to indicate whether or not a given number of highs are present on the inputs. However, unlike in subcircuit 300, instead of all of the functions <k2,0> to <k2,k2> being generated, only <k2,0>, <k2,1> and <k2,2> are generated. Thus, subcircuit 305 produces three output signals. Each of these output signals is passed to an input of subcircuit 310.

The subcircuit 310 is a non-hierarchical multiplexer similar to subcircuit 110 shown in FIG. 1, but having k1+1 inputs M0, . . . ,Mk1, and k1+1 control inputs S0, . . . ,Sk1. The outputs of subcircuit 300 are connected to the control inputs S0, . . . ,Sk of the multiplexer 310. The outputs <k2,2>, <k2,1> and <k2,0> of subcircuit 305 are connected to the inputs M0, M1 and M2 of the multiplexer 310 respectively.

The multiplexer inputs M3, . . . ,Mk2 that do not receive an output signal from subcircuit 305 are set to a fixed low value by connecting them to the circuit's earth terminal.

In order to output a high value from the multiplexer if and only if exactly two highs are present amongst the k=k1+k2 inputs, the output signals <k2,0>, <k2,1> and <k2,2> of subcircuit 305 are arranged on the inputs M2, M1 and M0 of the multiplexer 310 respectively. If none of the inputs to subcircuit 300 are high then S0 is high and M0 is selected, thus the output of the multiplexer 310 is <k2,2>, which is high only if two of the inputs to subcircuit 305 are high. If one of the inputs to subcircuit 300 is high, then S1 is high, and M1 is selected. Thus, the multiplexer output is high only if exactly one high is present amongst the inputs to subcircuit 305. If two of the inputs to subcircuit 300 are high, then S2 is high and M2 is selected. Thus, the multiplexer output is high only if none of the inputs to subcircuit 305 are high.

It is straightforward to adapt the circuit of FIG. 4 to generate <k,j> for other values of j, instead of the value of j=2 that is used in FIG. 4. For larger j than j=2, additional values of <k2,i> are generated, up to <k2,j>. The number of preset zero inputs for the multiplexer is reduced accordingly. However, for values of j larger than k2, at least some of the inputs X1, . . . ,Xk1 must be high to make up a total of j high inputs between X1, . . . ,Xk1 and Y1, . . . ,Yk2. Therefore, if none of these is high, and S0 is selected, then the required output will always be zero. Thus, for j greater than k2, the lowest of the inputs M0, . . . ,M0 can be connected to the earth rail to generate the required zero, and there would no longer be a need for subcircuit 305 to generate the lowest <k2,i> functions.

Each function <k2,i>, which refers to i highs amongst the k2 inputs of subcircuit 305, should be input to the (j-i)th M input of the multiplexer, unless it is to be replaced by a constant zero voltage. The multiplexer output will then be <kj> for our chosen value of j, because the multiplexer will, in effect, add the number of high inputs of subcircuit 300 to the number of high inputs of subcircuit 305, by selecting the appropriate output signal from subcircuit 305.

Although subcircuit 300 itself generates functions of the form <n,j>, the larger the value of n, the more complicated it becomes to generate each function <n,j> using combinations of logic gates. The circuit of FIG. 4 provides an efficient means of generating the <n,j> functions for a larger number of inputs n. The splitting of the inputs into two groups makes each level of the circuit simpler. In FIG. 4, the total set of k inputs is preferably split such that the number of inputs k1 to subcircuit 300 is greater than or just less than the number of inputs k2 to subcircuit 305. Thus, the multiplexer 310 has a control signal S0, . . . ,Sk1 provided by subcircuit 300 on each of its control inputs, whilst allowing all outputs of subcircuit 305 to be input to the multiplexer, and any one of them selected.

Figure 5:
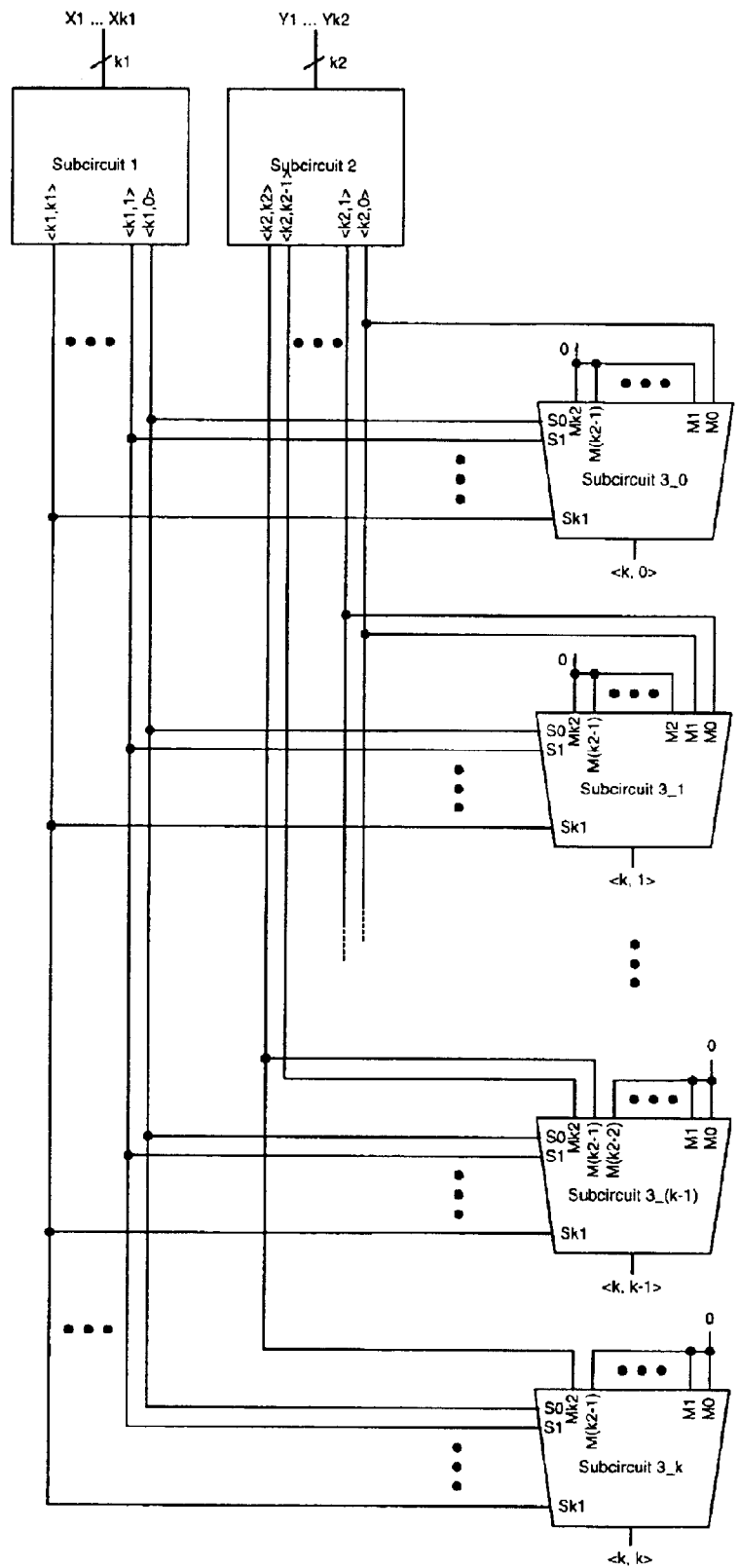
FIG. 5 is a block diagram showing a circuit according to a third embodiment of the invention.

FIG. 5 shows a circuit for generating the functions <k,j> for each value of j from 0 to k. The circuit comprises a subcircuit 300, a subcircuit 306, and subcircuits 3_0 to 3_k. Subcircuit 300 is identical to subcircuit 300 in FIG. 4, generating the functions <k₁,j> for values of j from 0 to k₁. Subcircuit 306 is similar to subcircuit 305 of FIG. 4, but generates functions <k2,j> for all values of j from 0 to k2. Subcircuit 3_2 (not shown) is identical to subcircuit 310 in FIG. 3. The set of subcircuits 3_0, . . . ,3_k1 form a series, in which the functions <k,0>, <k,1>, . . . ,<k,k-1> and <k,k> are generated. Each of these subcircuits 3_j functions as a multiplexer with k1+1 inputs, k1+1 control inputs and one output. The same set of control input signals is input to each one of subcircuits 3_0 to 3_k. However, the arrangement of the <k2,j> signals on the multiplexer Mj is chosen for each subcircuit such that each function <k2,i> is input to the (j-i)th M input of the multiplexer, unless j-i does not correspond to an integer between zero and k1, and thus is to be replaced by a constant zero voltage. The effect is to add together the number of high inputs of subcircuit 300 to the number of high inputs of subcircuit 306.

Only one of the output functions <k,0>, . . . ,<k,k> from the multiplexer subcircuits 3_0, . . . , 3_k will be high at any time, and all the others will be low, according to the total number of high inputs to both subcircuits 300 and 306.

Subcircuit 3_0 generates <k,0>, which indicates if no highs are present amongst k input. Thus if one or more of the inputs X1, . . . ,Xk1 to subcircuit 400 are high, then <k,0> will be zero. If none of inputs X1 . . . Xk1 are high, and if also none of inputs Y1 . . . Yk2 are high, then <k,0> will be high. Thus, control input S0 switches the M0 input of the multiplexer, which has input function <k2,0>, thereby giving an effective output of <k,0> which is high when there are no high inputs.

Subcircuit 3_1 generates <k,1>. If two or more of inputs $X_1 \ldots X_{k1}$ are high, then <k,1> will be zero. If exactly one of inputs $X_1 \ldots X_{k1}$ are high, then we need exactly none of inputs $Y_1 \ldots Y_{k2}$ to be high in order to give an output of <k,1> being high. Thus, <k2,0> is selected on the M inputs. If none of inputs $X_1 \ldots X_{k1}$ are high, then we need exactly one of inputs $Y_1 \ldots Y_{k2}$ to be high, in order to give an output of <k,1> being high, thus <k2,1> is selected on the M inputs.

Subcircuit 3_(k-1) generates <k,k-1>, which is high only when a single input is low and the remaining inputs are high. If any less than $k_1$-1 of inputs $X_1 \ldots X_{k1}$ are high, then <k,k-1> will be zero, because the total number of high inputs will fall short of k-1. If exactly $k_1$-1 of inputs $X_1 \ldots X_{k1}$ are high, then all of inputs $Y_1 \ldots Y_{k2}$ must be high in order to give an output of <k,k-1> that is high, thus <k2,k2> is selected on the M inputs. If all of inputs $X_1 \ldots X_{k1}$ are high, then we need exactly k2-1 of inputs Y1 . . . Yk2 to be high, in order to give an output of <k,k-1> that is high, thus <k2,k2-1> is selected on the M inputs.

Subcircuit 3_k generates <k,k>. Unless all of inputs $X_1 \ldots X_{k1}$ are high, then <k,k> will be zero. If all of inputs $X_1 \ldots X_{k1}$ are high, then we also need all of inputs $Y_1 \ldots Y_{k2}$ to be high in order to give an output of <k,k> as high, thus <k2,k2> is selected on the M inputs.

Figure 6:
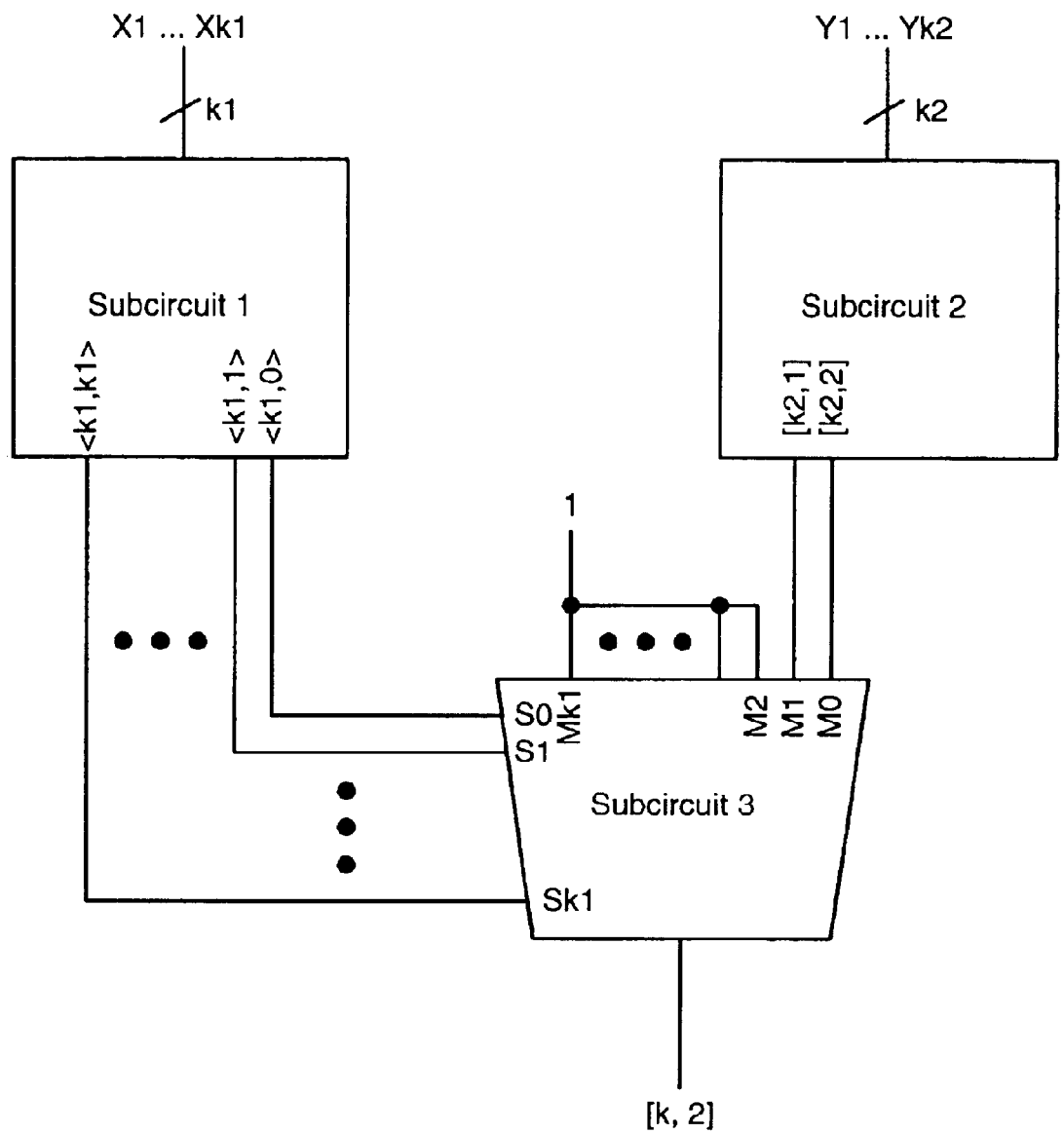
FIG. 6 is a block diagram showing a circuit according to a fourth embodiment of the invention.

FIG. 6 shows a circuit for generating the threshold function [k,2], which is high if two or more of the k inputs are high, but low if zero or one of the k inputs are high. Again, the k inputs are split into two groups, X1, . . . ,Xk1 and Y1, . . . ,Yk2, where the first group consists of k1 inputs, and the second group consists of k2 inputs. k1 is chosen to be larger than or equal to k2.

The circuit of FIG. 6 is built from three subcircuits. Subcircuit 400 generates the function <k1, j> for each value of j from 0 to k1, and this subcircuit is identical to subcircuit 300 of FIG. 4. Subcircuit 405 generates the threshold functions [k2,0] and [k2,1]. Subcircuit 410 is a multiplexer with control inputs S0, . . . ,Sk1 receiving input signals from subcircuit 400, and multiplexer inputs M0, . . . ,Mk1 receiving input signals from subcircuit 405.

If none of the inputs X1 . . . Xk1 of subcircuit 400 are high, then control input S0 is high, thus [k2,2] is selected as the output, as at least two high inputs must be found from Y1, . . . ,Yk2 to give a high value of [k,2]. If exactly one of the inputs X1 . . . Xk1 of subcircuit 400 is high, then control input S1 is high, and [k2,1] is selected as the output, as at least one high input must be found from Y1, . . . ,Yk2 to give a high value of [k,2]. If two or more of the inputs X1 . . . Xk1 of subcircuit 400 are high, then one of control inputs S2, . . . ,Sk1 is high. The corresponding M inputs M2, . . . ,Mk1 are all connected to the positive voltage rail of the circuit to automatically hold these inputs at a high value, as [k,2] will be then be high regardless of how many of Y1, . . . ,Yk2 are high, since at least two out of the total of k inputs are already high.

Figure 7:
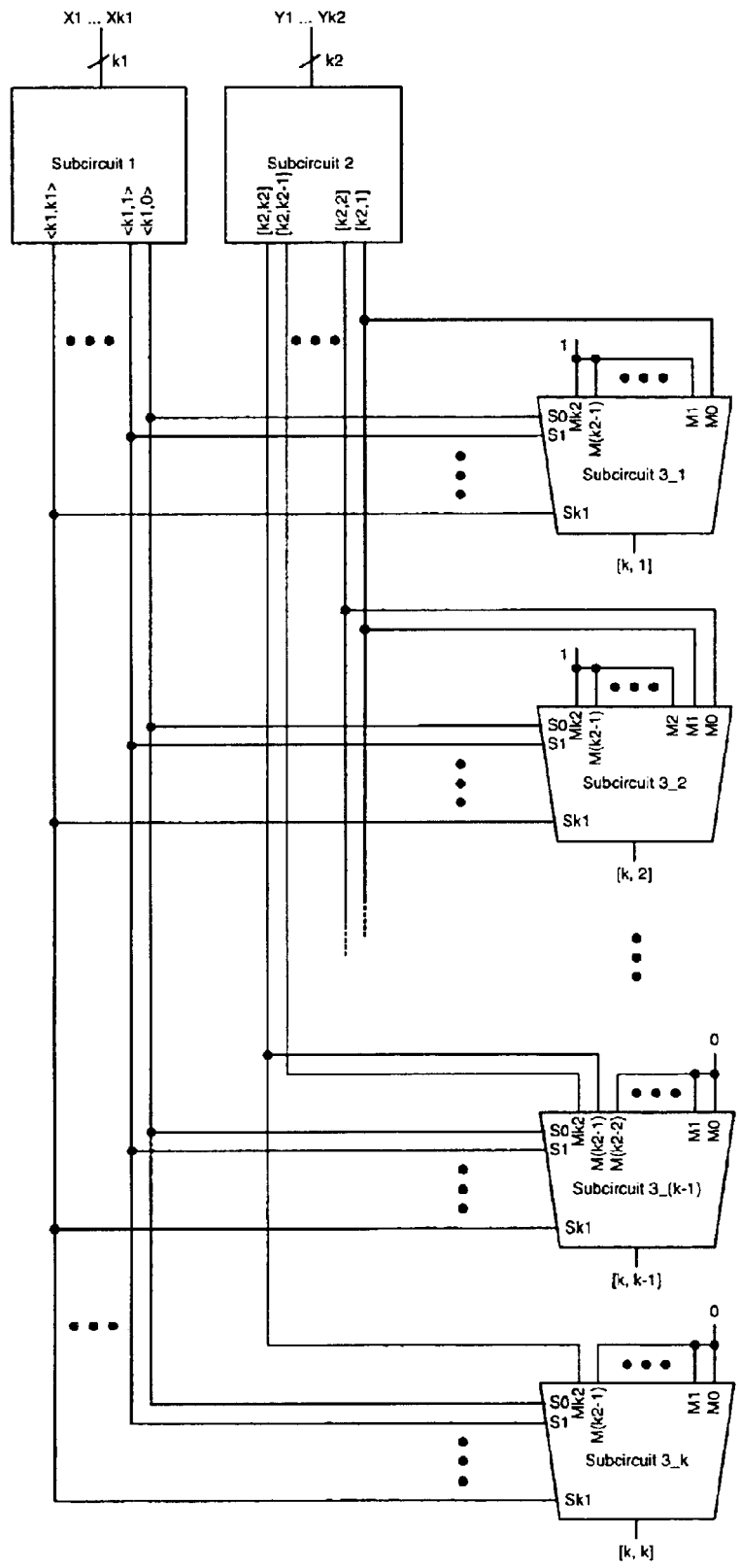
FIG. 7 is a block diagram showing a circuit according to a fifth embodiment of the invention.

FIG. 7 shows a circuit for generating a series of threshold functions [k,j] for j from 1 to k. The first stage is the same as that shown in FIG. 6, i.e. subcircuit 400 is used to generate <k1,j>. Subcircuit 406, which is very similar to subcircuit 405, generates the [k2,j] threshold functions, but for all values of j from 0 to k2. A plurality of multiplexers are provided, one for each threshold function to be generated. Only those for [k,1], [k,2], [k,k-1] and [k,k] are shown in the figure. Again, for each multiplexer, the control input Sj controls the switching of the multiplexer input Mj to the output of the multiplexer.

The [k,1] function is generated by connecting [k2,1] to the M0 input of the multiplexer 3_1 and holding every other input Mj to the multiplexer at a high value. The [k,2] function is generated by connecting [k2,2] to the M0 input of the multiplexer 3_1, connecting [k2,1] to the M1 input of the multiplexer 3_2, and holding each other input to the multiplexer Mj as high. The [k,k-1] function is generated by connecting [k2,k2] to the Mk2 input of the multiplexer 3_k-1, connecting the [k2,k2-1] function to the Mk2-1 input of the multiplexer 3_k-1, and holding each other input to the multiplexer Mj as high. The [k,k] function is generated by connecting [k2,k2] to the M0 input of the multiplexer 3_k and holding each other input to the multiplexer Mj as low.

The M inputs are chosen for each threshold function [k2,j] to give an additive effect with the selection functions <k1,i>, in a similar manner to that used in FIG. 5.

The embodiments of FIGS. 4 to 7 show how a counter or threshold circuit for determining whether a predetermined number of inputs are high out of a small number of inputs can be used to generate a function indicating whether a counter or threshold circuit for determining whether a predetermined number of inputs are high out of a larger total number of inputs.

This property can be used recursively to generate a circuit with a tree structure. An application of this method is in the implementation of a (n,k) counter, which counts the number of highs amongst n inputs and represents it in binary on k outputs. For a (7,3) counter having inputs X1 to X7 and outputs S1, S2 and S3 labelled in ascending order of binary weight, a method of implementation is as follows.

The lowest binary weight output can be generated by an XOR function between the inputs, i.e. S1={7,1}= X1⊕X2⊕X3⊕X4⊕X5⊕X6⊕X7

The middle binary weight output can be generated from the threshold functions [7,2], [7,6] and the complemented threshold function $[7,4]^c$. S2=[7,2] $[7,4]^c$ [7,6]

The highest binary weight output is simply equal to the threshold function +[7,6].

Figure 8:
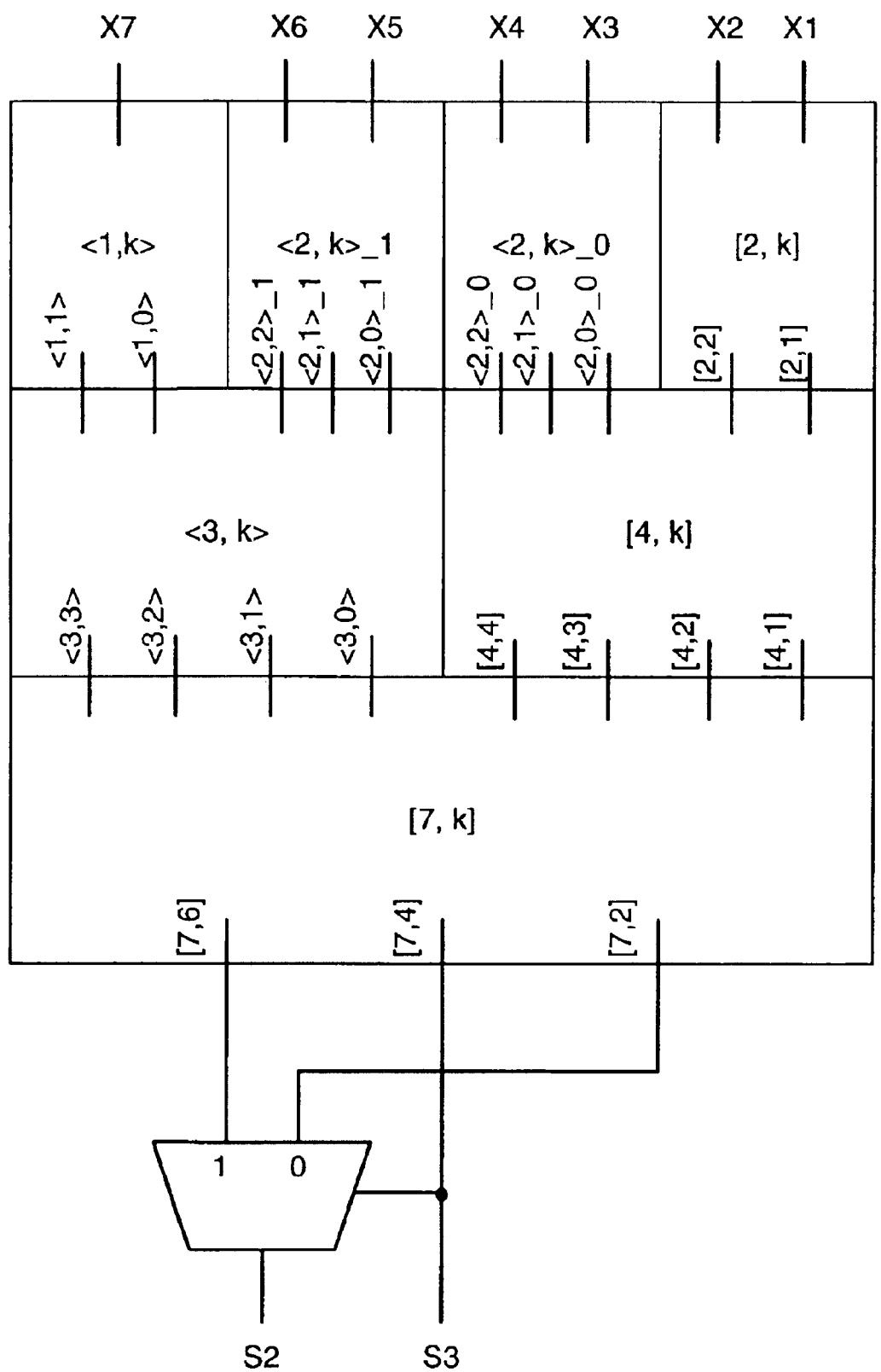
FIG. 8 is a block diagram of a (7, 3) counter according to a sixth embodiment of the invention.

FIG. 8 shows an implementation of a (7,4) counter A tree structure is used to generate threshold functions [2,k] and selection functions <2,k>_0, <2,k>_1 and <1,k> from pairs of inputs, X1 and X2; X3 and X4, X5 and X6, and using single input X7 respectively. (The "_0" and "_1" labels differentiate between the two different sets of functions of the same order but generated using different pairs of inputs). Then, pairs of first level outputs, are combined to give [4,k] and <3,k> type functions at second level outputs. Finally, the second level outputs are combined to give [7,k] threshold functions, in particular the [7,2], [7,4] and [7,6] threshold functions. The [7,4] value directly gives the S3 output, and the S2 output is found by setting [7,2] and [7,6] as multiplexer inputs, and selecting between them using the [7.4] output.

Figure 9:
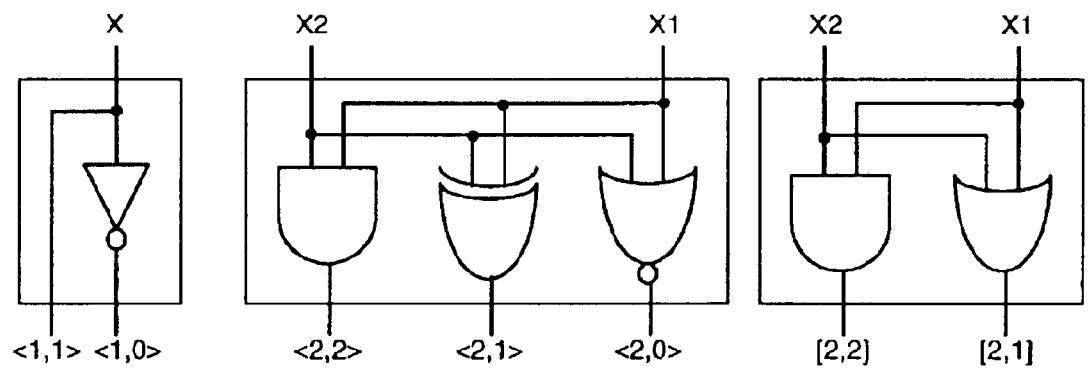
FIG. 9 is a circuit diagram showing a logic gate and transistor implementation of part of the circuitry of the (7,3) counter of FIG. 8.

FIG. 9 shows a logic implementation of functions <1,i>, <2,i> and [2,i]. The circuit on the left hand side shows an implementation of the function <1,i>, from a single input of X. The value of X itself gives <1,1>, without a need for any logic gates. The function <1,0> can be simply generated by connecting input X to an inverter, and taking the output of the inverter.

The circuit in the middle of FIG. 9 is an implementation of <2,i>, generated from inputs X1 and X2. X1 and X2 are connected to the inputs of an AND gate to produce <2,2>. X1 and X2 are connected to the inputs of an XOR gate, giving an output of <2,1>. X1 and X2 are also connected to the inputs of a NOR gate, giving an output of <2,0>.

The circuit on the right hand side of FIG. 9 is an implementation of [2,i]. Inputs X1 and X2 are connected to the inputs of an AND gate, giving an output of [2,2]. X1 and X2 are also connected to the inputs of an OR gate, giving an output of [2,1].

Figure 10:
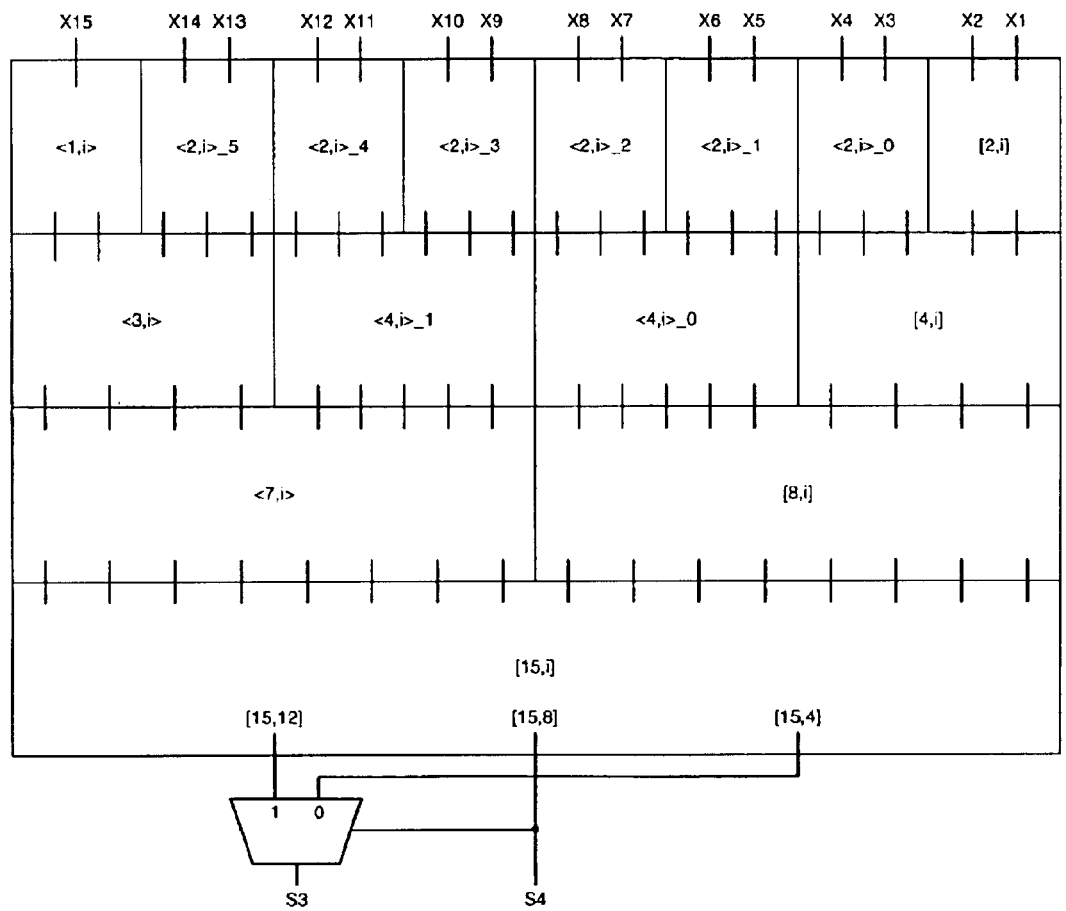
FIG. 10 is a block diagram of a (15,4) counter according to a seventh embodiment of the invention.

FIG. 10 shows an implementation of a (15,4) counter with maximum binary weight. The counter has 15 inputs, X1 to X15. In the first level, inputs X1 to X14 are combined in groups of two to generate the functions [2,i] for X1 and X2, <2,i>_0 for X3 and X4 (where the 0 is a label to differentiate from <2,i> for other inputs), <2,i>_1 for X5 and X6, <2,i>_2 for X7 and X8, <2,i>_3 for X9 and X10, <2,i>_4 for X11 and X12, and <2,i>_5 for X13 and X14. X15 is used to generate <1,i> in the first level of the binary tree.

In the second level of the binary tree, the functions, <4,i>_0, <4,i>_1, and <3,i> are generated from pairs of functions generated in the first level.

In the third level, the functions and <7,i> are generated from [4,i] and <4,i>_0, and from <4,i>_2 and <3,i> respectively.

In the fourth level [15,i] is generated from [8,i] and <7,i>.

[15,12] and [15,4] are then used as inputs to a multiplexer switched by [15,8] to generate S3, the third output bit of the (15,4) counter. [15,8] corresponds directly to the fourth output bit of the (15,4) counter. The first output bit of the (15,4) counter can be generated by an XOR function between each of the inputs.

On a component level, the selection functions <k,j> and/or the threshold functions [k,j] can be generated using a non-hierarchical multiplexer built from pass gates. However, where the multiplexer has some fixed high or low inputs, it is unnecessary to use full pass gates for these inputs, and single transistors will suffice in their place.

If the fixed input is a fixed high, a p-type transistor can be used, and the transistor can be connected between the positive voltage rail Vcc and the common output. If the fixed input is a fixed low, an n-type transistor can be used, and the transistor can be connected between ground and the common output.

The number of components can be further reduced for circuits in which only two possibilities exist for the M inputs of the multiplexer, e.g. a threshold function or selection function as an input to M0 and all other M inputs connected to the earth rail of the circuit. Similarly for a threshold or selection function input to M0 and all other M inputs connected to the positive voltage rail. In cases such as these, several pass gates may be replaced with a single transistor, as is described with reference to FIGS. 11A and B.

Figure 11A:
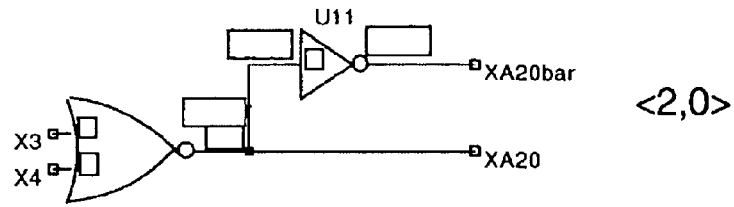
FIGS. 11A and 11B are circuit diagrams showing a transistor level implementation of part of the circuitry of the (15,4) counter of FIG. 10.
Figure 11A:
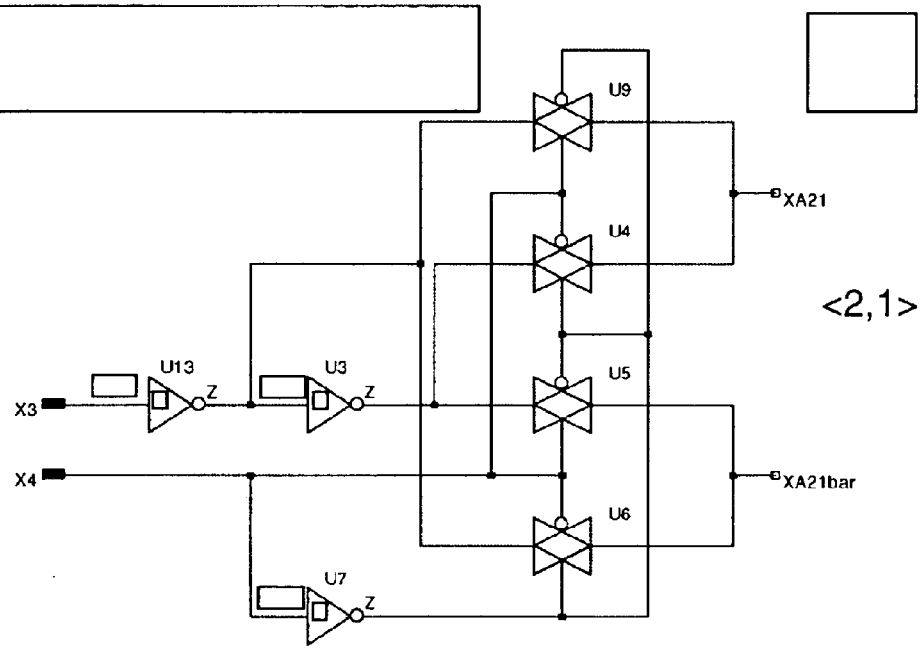
Figure 11A:
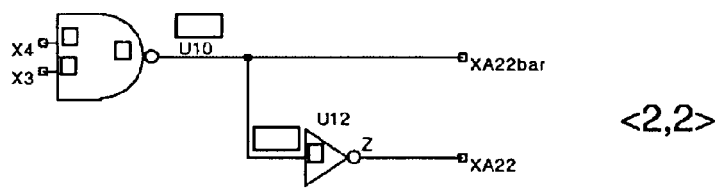
Figure 11A:
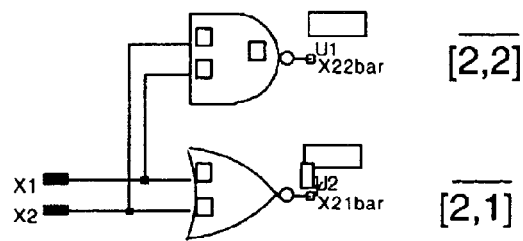
Figure 11B:
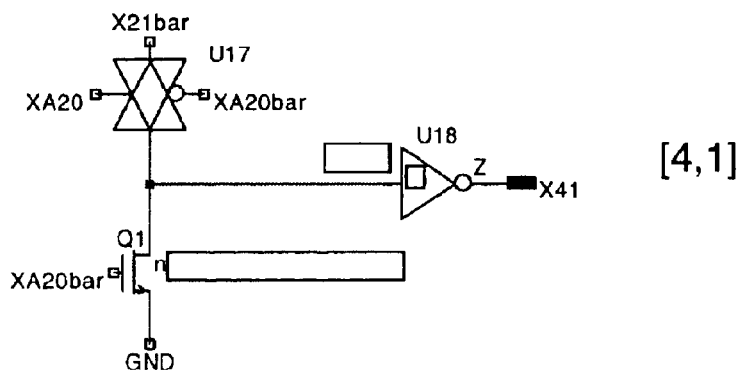
Figure 11B:
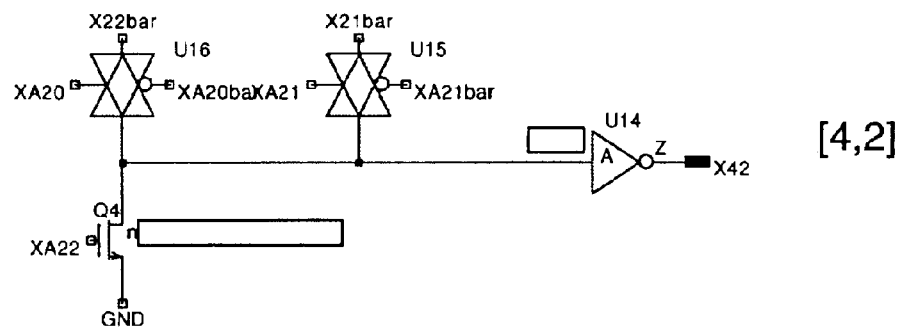
Figure 11B:
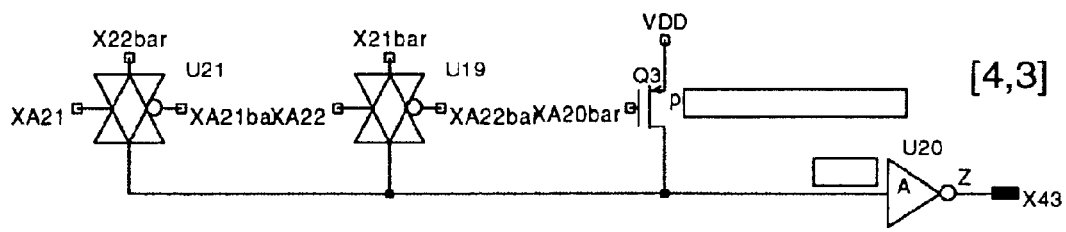
Figure 11B:
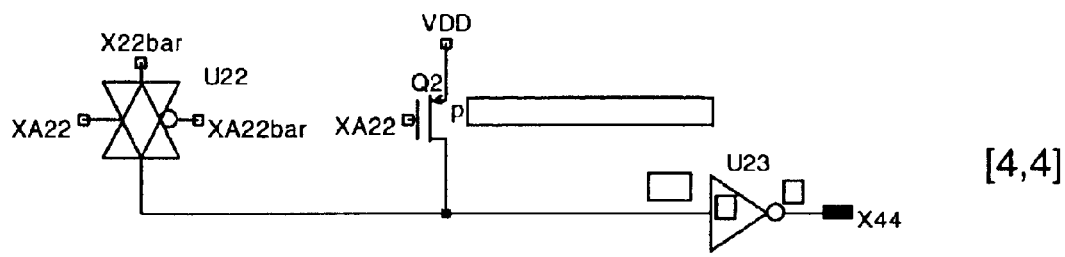

FIGS. 11A and 11B show a design optimised circuit for producing the threshold functions [4,j], and may be used in the implementation of the circuit of FIG. 10. FIG. 11A shows the generation of functions in the first level of the circuit of FIG. 10, and FIG. 11B shows the generation of the second level functions, using the first level functions.

FIG. 11A shows four circuit diagrams. The first is a circuit to produce <2,0> and its inverse using two inputs X3 and X4. The X3 and X4 inputs are connected to a NOR gate, giving an output of <2,0>, which is written as XA20. The output is also passed through an inverter U11 to give the inverse, which is written as XA20bar.

The second circuit of FIG. 11A is to produce <2,1> and its inverse using two inputs X3 and X4. Input X3 is passed through an inverter U13, and the output of the inverter U13 is connected to the source inputs of pass gates U9 and U6. The output of the inverter U13 is also connected to the input of a second inverter U3. The output of inverter U3 is connected to the source inputs of pass gates U4 and U5.

Input X4 is connected to the inverse gate inputs of pass gates U4 and U6, and to the gate input of pass gates U5 and U9. Input X4 is also connected to inverter U7, and the output of inverter U7 is connected to the inverse gate inputs of pass gates U5 and U9, and to the gate inputs of pass gates U4 and U6.

The outputs of pass gates U9 and U4 are connected together, and give <2,1>, which is labelled as XA21. The outputs of pass gates U5 and U6 are connected together and give the inverse of <2,1>, which is labelled as XA21bar. The combination of pass gates and inverters thus effectively acts as an XOR gate and an XNOR gate.

The third circuit of FIG. 11A is to produce <2,2>. The circuit has inputs X3 and X4, which are connected to the inputs of a NAND gate U10. The output of the NAND gate U10 is the inverse of <2,2>, which is written as XA22bar. The output of NAND gate U10 is also connected to an inverter to produce <2,2>, written as XA22.

The fourth circuit of FIG. 11A is to produce the inverse threshold functions [2,2]-bar and [2,1] -bar. Two inputs X1 and X2 are connected to a NAND gate U1. The output of the NAND gate U1 is [2,2]-bar, written as X22bar. [2,2]-bar is equivalent to the inverse of <2,2>. The two inputs X1 and X2 are also connected to the inputs of a NOR gate, which produces the output [2,1]-bar, written as X21bar. [2,1]-bar is equivalent to <2,0>.

FIG. 11B shows four circuits, one for generating each of the threshold functions [4,1], [4,2], [4,3] and [4,4]. These circuits are an optimised implementation of the non-hierarchical multiplexers shown in previous figures.

The first circuit is for generating the threshold function [4,1]. The input XA20 (which is the <2,0> function for inputs X3 and X4) is provided to the gate terminal of a pass gate U17, and its inverse XA20bar is provided to the inverse gate terminal of pass gate U17. Thus, when neither of inputs X3 and X4 are high, XA20 is high, and pass gate U17 is open.

On its source input, the pass gate U17 has X21bar (which is the inverse of [2,1] for inputs X1 and X2, and is equivalent to <2,0>). If the pass gate is open, and neither of X1 or X2 are high, then the pass gate output is high, which is inverted by the inverter U18, such that the circuit output is low. However, if either or both of X1 or X2 are high, then the inverter output is low, which is inverted by the inverter U18 such that the circuit output is high.

The circuit also has a n-type transistor Q1 with its source connected to ground, its gate connected to the XA20bar input (which is the inverse of the <2,0> function for inputs X3 and X4), and its drain connected to the input of inverter U 18. Thus, if one or both of X3 and X4 are high, then the transistor Q1 conducts, and the input to inverter U18 is low. The inverter U18 inverts this such that the circuit output is high.

It is possible to replace the n-type transistor Q1 with a pass gate. However, the use of a full pass gate is unnecessary, because the current will only flow in one direction through the transistor Q1 or replacement pass gate, due to the fixed ground connection. Thus, the use of a transistor instead of a pass gate provides a saving in cost and area.

The second circuit of FIG. 11B is for generating the threshold function [4,2]. The input XA20 (which is the <2,0> function for inputs X3 and X4) is provided to the gate terminal of a pass gate U16, and its inverse XA20bar is provided to the inverse gate terminal of pass gate U16. Thus, when neither of inputs X3 and X4 is high, XA20 is high, and pass gate U16 is open.

The input XA21 (which is the <2,1> function for inputs X3 and X4) is provided to the gate terminal of a pass gate U15, and its inverse XA21bar is provided to the inverse gate terminal of pass gate U15. Thus, when only one of inputs X3 and X4 are high, XA21 is high, and pass gate U15 is open.

The input XA22 (which is the <2,2> function for inputs X3 and X4) is provided to the gate terminal of an n-type transistor Q4. Thus, when both of inputs X3 and X4 are high, XA22 is high, and transistor Q4 conducts. The transistor Q4 has its source connected to ground, and its drain connected to the input of inverter U14. Thus, when the transistor Q4 conducts, the input to the inverter U14 is low, and the circuit output is high.

If instead, pass gate U15 is open, then X21bar (which is the inverse of [2,1] for inputs X1 and X2, and is equivalent to <2,0>) is output to the input of inverter U14. The pass gate U15 is open when only one of X3 and X4 are high. When one or two of X1 and X2 are high, the inverter U14 input is thus low, and the circuit output is high. However, if neither of X1 or X2 are high, then the inverter U14 input is high, and the circuit output is low.

If the open pass gate is pass gate U16, then X22bar (which is the inverse of [2,2] for inputs X1 and X2) is output to the input of inverter U14. The pass gate U16 is open when neither of X3 and X4 are high. When one or none of X1 and X2 are high, the inverter U14 input is thus high, and the circuit output is low. However, if both X1 and X2 are high, then the inverter U14 input is low, and the circuit output is high.

The third circuit of FIG. 11B is for generating the threshold function [4,3]. The input XA21 (which is the <2,1> function for inputs X3 and X4) is provided to the gate terminal of a pass gate U21, and its inverse XA21bar is provided to the inverse gate terminal of pass gate U21. Thus, when only one of inputs X3 and X4 are high, XA21 is high, and pass gate U21 is open.

The input XA22 (which is the <2,2> function for inputs X3 and X4) is provided to the gate terminal of a pass gate U19, and its inverse XA22bar is provided to the inverse gate terminal of pass gate U19. Thus, when both of inputs X3 and X4 are high, XA22 is high, and pass gate U19 is open.

The input XA20 (which is the <2,0> function for inputs X3 and X4) is provided to the gate terminal of an p-type transistor Q3. Thus, when neither of inputs X3 and X4 are high, XA20 is high, and transistor Q3 conducts. The transistor Q3 has its source connected to a voltage VDD, and its drain connected to the input of inverter U20.

Thus, when the transistor Q3 conducts, the input to the inverter U20 is high, and the circuit output is low.

If instead, pass gate U19 is open, then X21bar (which is the inverse of [2,1] for inputs X1 and X2) is output to the input of inverter U20. The pass gate U19 is open when both of X3 and X4 are high. When one or two of X1 and X2 are high, the inverter U20 input is thus low, and the circuit output is high. However, if neither of X1 and X2 are high, then the inverter U20 input is high, and the circuit output is low.

If the open pass gate is pass gate U21, then X22bar (which is the inverse of [2,2] for inputs X1 and X2) is output to the input of inverter U20. The pass gate U21 is open when only one of X3 and X4 is high. When both of X1 and X2 are high, the inverter U20 input is thus low, and the circuit output is high. However, if at least one of X1 and X2 is low, then the inverter U20 input is high, and the circuit output is low.

The fourth circuit of FIG. 11B is for generating the threshold function [4,4]. The input XA22 (which is the <2,2> function for inputs X3 and X4) is provided to the gate terminal of a pass gate U22, and its inverse XA22bar is provided to the inverse gate terminal of pass gate U22. Thus, when both of inputs X3 and X4 are high, XA22 is high, and pass gate U22 is open.

The input XA22 is also provided at the gate terminal of an p-type transistor Q2. Thus, when both of inputs X3 and X4 are high, XA22 is high, and transistor Q2 does not conduct, due to being p-type. However, when at least one of X3 and X4 is not high, the transistor Q2 conducts. The transistor Q2 has its source connected to a voltage VDD, and its drain connected to the input of inverter U23. Thus, when the transistor Q2 conducts, the input to the inverter U23 is high, and the circuit output is low.

If pass gate U22 is open, then X22bar (which is the inverse of [2,2] for inputs X1 and X2) is output to the input of inverter U23. The pass gate U22 is open when both of X3 and X4 are high. When both of X1 and X2 are high, the inverter U23 input is thus low, and the circuit output is high. However, if at least one of X1 and X2 is low, then the inverter U23 input is high, and the circuit output is low.

Although the embodiment of FIGS. 11A and 11B use a single transistor, embodiments of the present invention encompass the use of any number. Any number of fixed low or high inputs to one multiplexer with <n,i> select signals can be replaced by k n/p transistors in parallel or alternatively by n+1-k n/p transistors in series.

In particular embodiments, the circuit of the invention may be a parallel counter, or a multiplier circuit, or a memory control circuit.

A further embodiment of the invention is an integrated circuit including any circuit according to the invention. The invention also encompasses circuit boards including any circuit according to the invention, and digital electronic devices including any circuit according to the invention.

Embodiments of the present invention provides an implementation of a generalised high-speed digital circuit to count any given number of bits.

Embodiments of the present invention are suitable for standard cell technology in which the inputs and outputs are well defined. The use of high input impedance devices such as inverters at the inputs and outputs of the pass gates facilities this.

Embodiments of the present invention described herein include a circuit for selecting one of a second set of binary inputs according to the number of high input signals applied to a first set of binary inputs, the circuit including: a first subcircuit having said first set of binary inputs, and logic for generating a set of control output signals, wherein each control output signal represents whether or not the first set of binary inputs has exactly a predetermined number of high input signals, and wherein each control output signal corresponds to a different said predetermined number of high input signals; and a second subcircuit having said second set of binary inputs, a set of control inputs for receiving control output signals from the first subcircuit, and logic comprising a plurality of switching components including one or more pass gates, each said switching component being switchable to connect or isolate one of the second set of inputs to a common output, wherein the control inputs are used to control the switching of the switching components, and wherein the first and second subcircuits are configured such that only one switching component can be switched to connect at any one time.

While the invention has been described in terms of what are at present its preferred embodiments, it will be apparent to those skilled in the art that various changes can be made to the preferred embodiments without departing from the spirit and scope of the invention.

What is claimed is:

1. A circuit for selecting one of a second set of binary inputs according to the number of high input signals applied to a first set of one or more binary inputs, the circuit comprising:
    a first subcircuit having said first set of binary inputs, and logic for generating a set of control output signals, wherein each control output signal represents whether or not the first set of binary inputs has exactly a predetermined number of high input signals, and wherein each control output signal corresponds to a different said predetermined number of high input signals; and
    a second subcircuit having said second set of binary inputs, a set of control inputs for receiving control output signals from the first subcircuit, and logic comprising a plurality of switching components including one or more pass gates, each said switching component being switchable to connect or isolate one of the second set of inputs to a common output, wherein the control inputs are connected to control the switching of the switching components to connect only one of said second set of binary inputs to said common output at any one time.

2. A circuit as claimed in claim 1, wherein said switching components include one or more transistors, each said transistor being connected to receive an input from a constant high or low voltage source.

3. A circuit as claimed in claim 1, wherein the number of control output signals of the first subcircuit is one greater than the number of binary inputs in the first set of binary inputs.

4. A circuit as claimed in claim 1, wherein the set of control inputs of the second subcircuit are connected to control the switching elements, in a one-to-one correspondence between control inputs and switching elements.

5. A circuit as claimed in claim 1, wherein the first subcircuit is configured to generate only a single high control output signal at any time.

6. A circuit as claimed in claim 1, wherein the first subcircuit is configured to generate only a single low control output signal at any time.

7. A circuit as claimed in claim 1, wherein said set of control inputs of the second subcircuit consists of a single control input, and the second subcircuit comprises an inverter having an input connected to said single control input, wherein said single control input is connected to control a first switching component, and an output of the inverter is connected to control a second switching component.

8. A circuit as claimed in claim 1, wherein said switching components are connected to said common output via low output impedance buffer means.

9. A circuit as claimed in claim 8, wherein said low output impedance buffer means comprises an inverter.

10. A circuit as claimed in claim 1, further comprising a third subcircuit, the third subcircuit having a third set of binary inputs and logic to generate one or more output signals indicating if the number of highs or lows amongst the third set of binary inputs belongs to a particular subset of the integers $\{0, \ldots, n\}$, each said output signal corresponding to a different particular subset of the integers $\{0, \ldots, n\}$, wherein n is the number of binary inputs in the third set of binary inputs, and wherein one or more of the second set of binary inputs of the second subcircuit is connected to receive an output signal from the third subcircuit.

11. A circuit as claimed in claim 10, wherein said logic of the third subcircuit is adapted such that only one said output signal from the third subcircuit is high at any time.

12. A circuit as claimed in claim 10, wherein said logic of the third subcircuit is adapted such that only one said output signal from the third subcircuit is low at any time.

13. A circuit as claimed in claim 10, wherein said particular subset of the integers $\{0, \ldots, n\}$ comprises a single integer.

14. A circuit as claimed in claim 13, wherein each of a plurality of said control inputs of the second subcircuit indicate whether a respective number p of highs are present amongst the first set of binary inputs and is connected to control a respective switching element with an input indicating whether a respective number of at least q highs are present amongst the third set of binary inputs, wherein the sum of p and q has the same value for each of said plurality of switching elements.

15. A circuit as claimed in claim 14, wherein a plurality of second subcircuits are provided to generate a plurality of third subcircuit outputs, each second subcircuit corresponding to a different sum of p and q.

16. A logic circuit including the circuit of claim 14, said logic circuit having inputs arranged in a tree structure, wherein at each level of the tree a plurality of first and third subcircuits accept level inputs to said level and a plurality of third subcircuits each accept inputs from a first and third subcircuit and generate a signal for input to the next level of the tree.

17. A parallel counter comprising:
    a plurality of lower level logic units each having the circuit of claim 14; and
    a plurality of higher level logic units each having a circuit with two sets of binary inputs, an output, and logic connecting the binary inputs to the output, the logic being for generating an output signal indicating if the total number of highs or lows amongst the two set of inputs belongs to a particular subset of the integers {0, . . . , n} wherein n is the total number of inputs in the two sets of inputs;

wherein said logic units are arranged hierarchically such that the output of the lower level logic units is passed to higher level logic units.

18. A parallel counter comprising a plurality of circuits according to claim 14, wherein said plurality of circuits are arranged hierarchically such that the first and third subcircuit of each higher level circuit comprises a lower level circuit.

19. A parallel counter comprising the circuit of claim 14, wherein the binary inputs of said second set of inputs and said first set of inputs are divided according to a binary tree into inputs to a plurality of logic units.

20. A circuit as claimed in claim 10, wherein said particular subset of the integers {0, . . . , n} comprises all integers greater than or equal to a predetermined integer and less than or equal to n.

21. A circuit as claimed in claim 20, wherein each of a plurality of said control inputs of the second subcircuit indicate whether a respective number p of highs are present amongst the first set of binary inputs and is connected to control a respective switching element with an input indicating whether a respective number of at least q highs are present amongst the third set of binary inputs, wherein the sum of p and q has the same value for each of said plurality of switching elements.

22. A circuit as claimed in claim 21, wherein a plurality of second subcircuits are provided to generate a plurality of third subcircuit outputs, each second subcircuit corresponding to a different sum of p and q.

23. A logic circuit including the circuit of claim 21, said logic circuit having inputs arranged in a tree structure, wherein at each level of the tree a plurality of first and third subcircuits accept level inputs to said level and a plurality of third subcircuits each accept inputs from a first and third subcircuit and generate a signal for input to the next level of the tree.

24. A parallel counter comprising:

a plurality of lower level logic units each having the circuit of claim 16; and a plurality of higher level logic units each having a circuit with two sets of binary inputs, an output, and logic connecting the binary inputs to the output, the logic being for generating an output signal indicating if the total number of highs or lows amongst the two set of inputs belongs to a particular subset of the integers {0, . . . , n} wherein n is the total number of inputs in the two sets of inputs;

wherein said logic units are arranged hierarchically such that the output of the lower level logic units is passed to higher level logic units.

25. A parallel counter comprising a plurality of circuits according to claim 21, wherein said plurality of circuits are arranged hierarchically such that the first and third subcircuit of each higher level circuit comprises a lower level circuit.

26. A parallel counter comprising the circuit of claim 21, wherein the binary inputs of said second set of inputs and said first set of inputs are divided according to a binary tree into inputs to a plurality of logic units.

27. A parallel counter comprising at least one circuit according to claim 1.

28. A logic circuit including the parallel counter of claim 27.

29. An integrated circuit including the parallel counter of claim 27.

30. A multiplier circuit comprising a parallel counter according to claim 27.

31. A memory control circuit comprising a circuit according to claim 1.

32. A circuit board comprising the circuit of claim 1.

33. A digital electronic device including the circuit of claim 1.

* * * * *